(12) United States Patent
Tam et al.

(10) Patent No.: US 9,768,743 B1
(45) Date of Patent: Sep. 19, 2017

(54) MEMORY EFFECT REDUCTION USING LOW IMPEDANCE CASCODE BIASING

(71) Applicant: Marvell International Ltd., Hamilton (BM)

(72) Inventors: Sai-Wang Tam, Sunnyvale, CA (US); Philip Godoy, Sunnyvale, CA (US); Ming He, Fremont, CA (US); Renaldi Winoto, Danville, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/730,142

(22) Filed: Jun. 3, 2015

Related U.S. Application Data

(60) Provisional application No. 62/012,923, filed on Jun. 16, 2014.

(51) Int. Cl.
*H03F 3/21* (2006.01)
*H03F 1/32* (2006.01)
*H03F 3/26* (2006.01)

(52) U.S. Cl.
CPC .......... *H03F 3/211* (2013.01); *H03F 1/3247* (2013.01); *H03F 2200/129* (2013.01); *H03F 2200/555* (2013.01); *H03F 2201/3224* (2013.01); *H03F 2203/21157* (2013.01)

(58) Field of Classification Search
USPC ................................ 330/285, 296, 311, 307
See application file for complete search history.

(56) References Cited

U.S. PATENT DOCUMENTS

| | | | |
|---|---|---|---|
| 6,300,837 B1 * | 10/2001 | Sowlati ................. | H03F 1/0261 330/267 |
| 7,365,604 B2 * | 4/2008 | Luo ........................... | H03F 1/30 330/285 |
| 7,728,672 B2 * | 6/2010 | Choi ....................... | H03F 3/189 330/296 |
| 8,106,712 B2 * | 1/2012 | Lee ........................ | H03F 1/0261 330/285 |
| 2016/0134242 A1 * | 5/2016 | Watanabe ................ | H03F 3/19 330/296 |

\* cited by examiner

*Primary Examiner* — Hieu Nguyen

(57) ABSTRACT

A circuit includes a reference voltage circuit, a filter circuit configured to receive an output of the reference voltage circuit, and a voltage follower configured to receive an output of the filter circuit and generate a bias voltage. The filter circuit is configured to combine signals on a reference ground with the output of the reference voltage circuit. A method of providing a bias voltage includes generating a reference voltage using a reference voltage circuit, filtering the reference voltage to generate a second voltage using a filter circuit, and generating the bias voltage according to the second voltage using a voltage follower circuit. Filtering the reference voltage includes combining a fluctuation of the reference ground with the reference voltage.

17 Claims, 3 Drawing Sheets

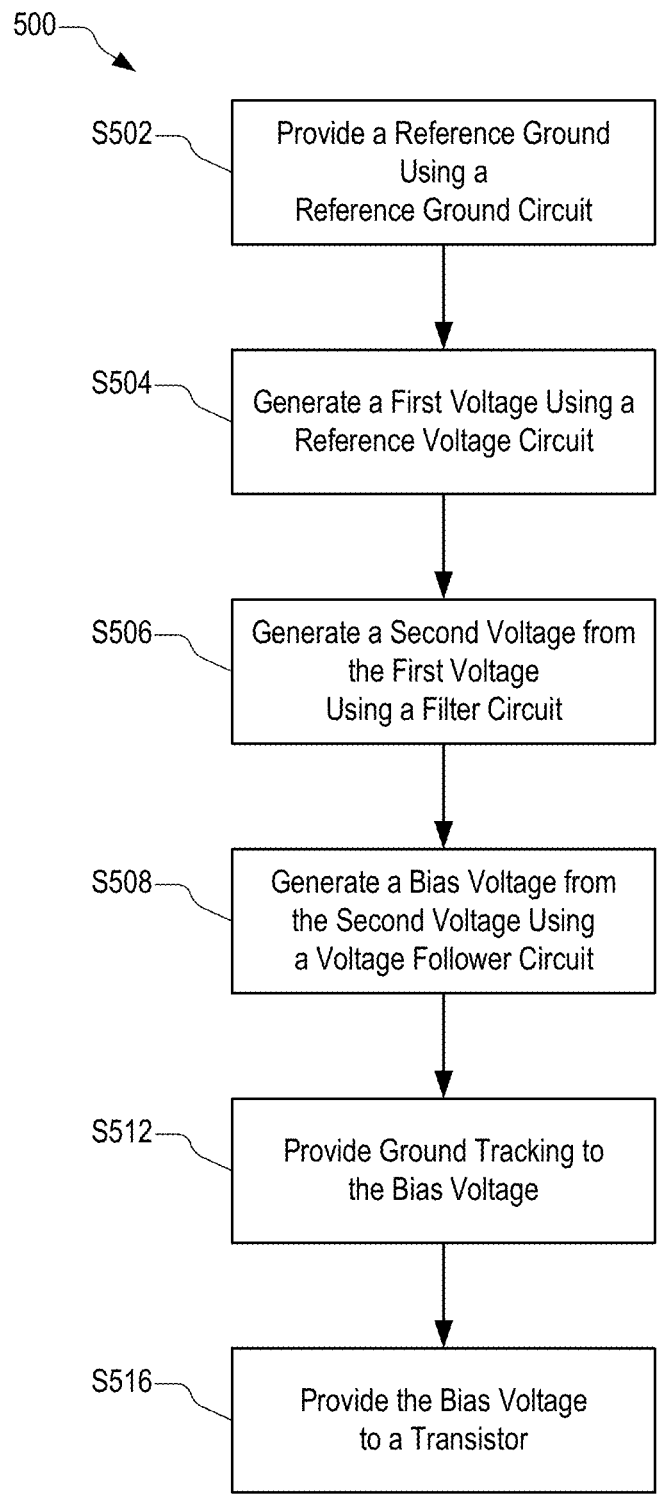

MEMORY EFFECT REDUCTION USING LOW IMPEDANCE CASCODE BIASING

CROSS REFERENCE TO RELATED APPLICATION

The present disclosure claims the benefit of U.S. Provisional Application No. 62/012,923, filed on Jun. 16, 2014, which is incorporated by reference herein in its entirety.

BACKGROUND

The amplitude of the output of an idealized amplifier at a point in time depends only on the amplitude of the input to the amplifier at that time. A non-linearity is a deviation of the behavior of a real amplifier from the idealized amplifier.

A memory effect is a form of non-linearity where the amplitude of the output of a (non-ideal) amplifier is affected by the amplitude of the input at a plurality of prior points in time. The non-linearity caused by memory effects introduces distortion into the output of the amplifier.

Memory effects may be caused by feedback loops within the amplifier that have substantial time constants, such as Automatic Gain Control (AGC) circuits and bias circuits.

SUMMARY

In an embodiment, a circuit includes a reference voltage circuit, a filter circuit configured to receive an output of the reference voltage circuit, and a voltage follower configured to receive an output of the filter circuit and generate a bias voltage. The filter circuit is configured to combine signals on a reference ground with the output of the reference voltage circuit.

In an embodiment, the voltage follower circuit includes a transistor and a current source coupled to the transistor. A control terminal of the transistor is configured to receive the output of the filter circuit.

In an embodiment, the voltage follower circuit includes a feedback loop circuit including an amplifier.

In an embodiment, the circuit is configured to provide the bias voltage to a biased transistor, and a power supply voltage supplied to the biased transistor is supplied to the voltage follower circuit.

In an embodiment, the signals have respective frequencies higher than a corner frequency of the filter circuit.

In an embodiment, the corner frequency is lower than frequencies making up a substantial majority of a baseband signal.

In an embodiment, the filter circuit includes a resistor-capacitor filter circuit.

In an embodiment, the circuit is configured to provide the bias voltage to a biased transistor. The circuit further includes a reference ground circuit coupled between the biased transistor and one or more components of the circuit.

In an embodiment, the circuit includes a capacitor configured to electrically couple the bias voltage to the reference ground circuit. In an embodiment, the reference ground circuit is directly connected to a power ground network at a location near the biased transistor.

In an embodiment, the circuit is configured to provide the bias voltage to a biased transistor included in a cascode stage.

In an embodiment, the circuit is provided in an integrated circuit.

In an embodiment, a method of providing a bias voltage includes generating a reference voltage using a reference voltage circuit, filtering the reference voltage to generate a second voltage using a filter circuit, and generating the bias voltage according to the second voltage using a voltage follower circuit. Filtering the reference voltage includes combining a fluctuation of a reference ground with the reference voltage.

In an embodiment, the method includes providing the bias voltage to a transistor, wherein the transistor is configured to operate as a cascode transistor. In an embodiment, the method includes providing a core power supply voltage to the transistor and the voltage follower circuit.

In an embodiment, the reference voltage circuit is directly connected to a bias circuit ground, the filter circuit is connected to the reference ground, and the voltage follower circuit is connected to the reference ground.

In an embodiment, the fluctuation has a frequency greater than a corner frequency of the filter circuit.

In an embodiment, the corner frequency of the filter circuit is lower than substantially all of the frequencies that make up a baseband signal.

In an embodiment, the method further includes coupling, using a capacitor, the fluctuation of the reference ground to the bias voltage.

In an embodiment, the voltage follower circuit includes an amplifier configured in a feedback loop.

BRIEF DESCRIPTION OF THE DRAWINGS

FIG. 5 illustrates a process of biasing a transistor.

DETAILED DESCRIPTION

Figure 1:
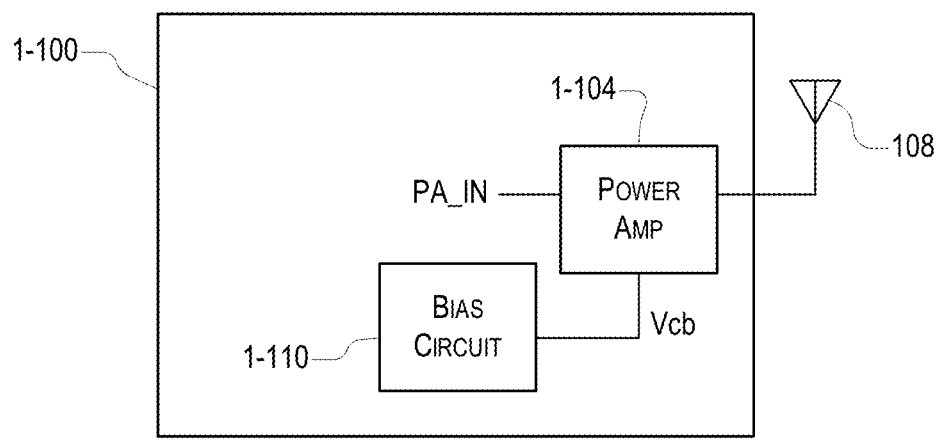
FIG. 1 is a block diagram of an integrated circuit according to an embodiment.

FIG. 1 is a block diagram of an integrated circuit (IC) 1-100 according to an embodiment of the present disclosure. The IC 1-100 includes a power amplifier (PA) 1-104 and a bias circuit 1-110. The output of the PA 1-104 is connected to an antenna 108. The PA 1-104 includes a cascode stage. The bias circuit 1-110 provides a cascode bias voltage Vcb to the cascode stage of the PA 1-104.

An input signal PA_IN is provided to the PA 1-104. In an embodiment, the PA 1-104 amplifies the input signal PA_IN using the cascode stage. In an embodiment, the input signal PA_IN includes a carrier frequency signal modulated according to a baseband signal. The carrier frequency signal may have a frequency substantially higher than frequencies of the baseband signal.

Although FIG. 1 shows the output PA 1-104 connected to the antenna 108, embodiments are not limited thereto. In an embodiment, the output of the PA 1-104 could be connected to a sonic transducer, an optical transducer, a mechanical transducer, another amplifier, a transmission line, and the like.

Figure 2:
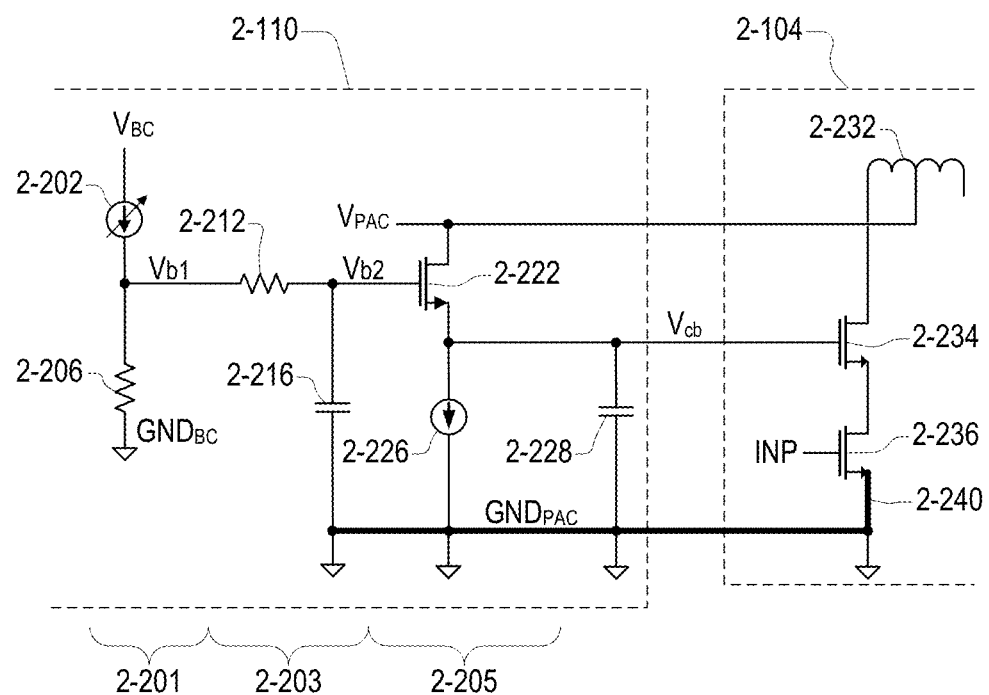
FIG. 2 is a diagram of a circuit according to an embodiment.

FIG. 2 is a diagram of a bias circuit 2-110 suitable for use in the bias circuit 1-110 of FIG. 1 according to an embodiment. Also shown is a subcircuit of a PA 2-104 suitable for use in the PA 1-104 of FIG. 1. The bias circuit 2-110 provides a cascode bias voltage Vcb to the PA 2-104.

The PA 2-104 includes a center-tapped coil 2-232. A center tap of the coil 2-232 is connected to a PA core supply voltage $V_{PAC}$. An end tap of the coil 2-232 is connected to a drain of a cascode transistor 2-234.

A source of the cascode transistor 2-234 is electrically connected to a drain of an input transistor 2-236. A gate of the cascode transistor 2-234 receives the cascode bias voltage Vcb from the bias circuit 2-110. In an embodiment, the cascode transistor 2-234 is an n-channel Metal-Oxide-Semiconductor Field Effect Transistor (nMOSFET).

A gate of the input transistor 2-236 receives an input signal INP. A source of the input transistor 2-236 is connected to a power ground (indicated in FIG. 2 by an inverted triangle) and to a PA core ground circuit (or a reference ground circuit) 2-240 that provides the PA core ground $GND_{PAC}$. In an embodiment, the input transistor 2-236 is an nMOSFET.

The power ground is provided using a power ground network (not shown). The PA core ground circuit 2-240 includes conductive elements other than the conductive elements of the power ground network.

The input transistor 2-236 and cascode transistor 2-234 operate as a cascode amplifier stage, in which the input transistor 2-236 operates as a transconductance amplifier and the cascode transistor 2-234 operates to increase the output impedance of the stage. A person of skill in the art in light of the teachings and disclosures herein would understand the operation and design of the cascode amplifier stage including the input transistor 2-236 and the cascode transistor 2-234.

The bias circuit 2-110 provides the cascode bias voltage Vcb to the PA 2-104. The bias circuit 2-110 includes a bias voltage generator (or a reference voltage circuit) 2-201, a filter circuit 2-203, a voltage follower circuit 2-205, and a bias capacitor 2-228.

The bias voltage generator 2-201 operates to provide a first bias voltage Vb1. The bias voltage generator 2-201 includes a programmable current source 2-202 and a first resistor 2-206.

A first terminal of the programmable current source 2-202 is connected to a bias core supply voltage $V_{BC}$. A second terminal of the programmable current source 2-202 is connected to a first terminal of the first resistor 2-206. A second terminal of the first resistor 2-206 is connected to a bias core ground $GND_{BC}$.

The first bias voltage Vb1 is provided at the second terminal of the programmable current source 2-202. A person of skill in the art in light of the teachings and disclosures herein would be aware of other circuits that could be used to provide the first bias voltage Vb1.

The filter circuit 2-203 operates to combine the first bias voltage Vb1 with voltage fluctuations of the PA core ground $GND_{PAC}$ to produce a second bias voltage Vb2. The filter circuit 2-203 includes a second resistor 2-212 and a filter capacitor 2-216.

A first terminal of the second resistor 2-212 receives the first bias voltage Vb1 from the bias voltage generator 2-201. A second terminal of the second resistor 2-212 is electrically connected to a first terminal of the filter capacitor 2-216. The second bias voltage Vb2 is produced at the first terminal of the filter capacitor 2-216.

A second terminal of the filter capacitor 2-216 is electrically connected to the power ground (indicated in FIG. 2 by an inverted triangle) and to the PA core ground circuit 2-240 that provides the PA core ground $GND_{PAC}$. The PA core ground circuit 2-240 operates to provide a reference ground, so that a voltage level of a ground in the bias circuit 2-110 tracks a voltage level of a ground in the PA 2-104.

The filter circuit 2-203 operates as a high-pass filter from the PA core ground $GND_{PAC}$ to the second bias voltage Vb2. Fluctuations in the voltage value of the PA core ground $GND_{PAC}$ that are above a corner frequency of the filter circuit 2-203 are added to the voltage value of the first bias voltage Vb1 to produce the second bias voltage Vb2.

As a result, variations in a voltage value of the second bias voltage Vb2 relative to the PA core ground $GND_{PAC}$, such as might result from, for example, changes in an amount of current drawn by the PA 2-104, are reduced.

In an embodiment wherein the amount of current drawn by the PA 2-104 corresponds to a magnitude of a baseband signal, the corner frequency of the filter circuit 2-203 is selected to be lower than substantially all (e.g., lower than 99%) of the frequencies that make up the baseband signal. In an implementation, the corner frequency of the filter circuit 2-203 is selected to be lower than 99.5% of the frequencies that make up the baseband signal. In another implementation, the corner frequency of the filter circuit 2-203 is selected to be lower than 99.8% of the frequencies that make up the baseband signal. In an embodiment wherein the baseband signal includes very little signal below 100 KHz, the corner frequency of the filter circuit 2-203 is below 100 KHz.

In an embodiment, a resistance of the second resistor 2-212 has a value of 100 kilo-ohms. In an embodiment, a capacitance of the filter capacitor 2-216 has a value of 10 picofarads.

The voltage follower circuit 2-205 operates to provide the cascode bias voltage Vcb according to the second bias voltage Vb2 and to isolate the bias voltage generator 2-201 and the filter circuit 2-203 from loads that receive the cascode bias voltage Vcb. The voltage follower circuit 2-205 is configured to provide the cascode bias voltage Vcb having a wide-band low output impedance. The voltage follower circuit 2-205 includes a follower transistor 2-222 and a current source 2-226.

A gate of the follower transistor 2-222 is configured to receive the second bias voltage Vb2. A drain of the follower transistor 2-222 is electrically connected to the PA core supply voltage $V_{PAC}$. A source of the follower transistor 2-222 is electrically connected to a first terminal of the current source 2-226. In an embodiment, the follower transistor 2-222 is an nMOSFET.

A second terminal of the current source 2-226 is electrically connected to the power ground (indicated in FIG. 2 by an inverted triangle) and to the PA core ground $GND_{PAC}$ through the PA core ground circuit 2-240. The cascode bias voltage Vcb is provided at the first terminal of the current source 2-226.

A first terminal of the bias capacitor 2-228 is electrically connected to the first terminal of the current source 2-226. A second terminal of the bias capacitor 2-228 is electrically connected to the PA core ground $GND_{PAC}$ through the PA core ground circuit 2-240.

The bias capacitor 2-228 is configured to couple high-frequency signals present on the PA core ground $GND_{PAC}$ to the cascode bias voltage Vcb. In an embodiment, the high-frequency signals include frequencies of the baseband signal. The bias capacitor 2-228 operates to provide ground tracking to the cascode bias voltage Vcb, as measured relative to the PA core ground $GND_{PAC}$.

Figure 3:
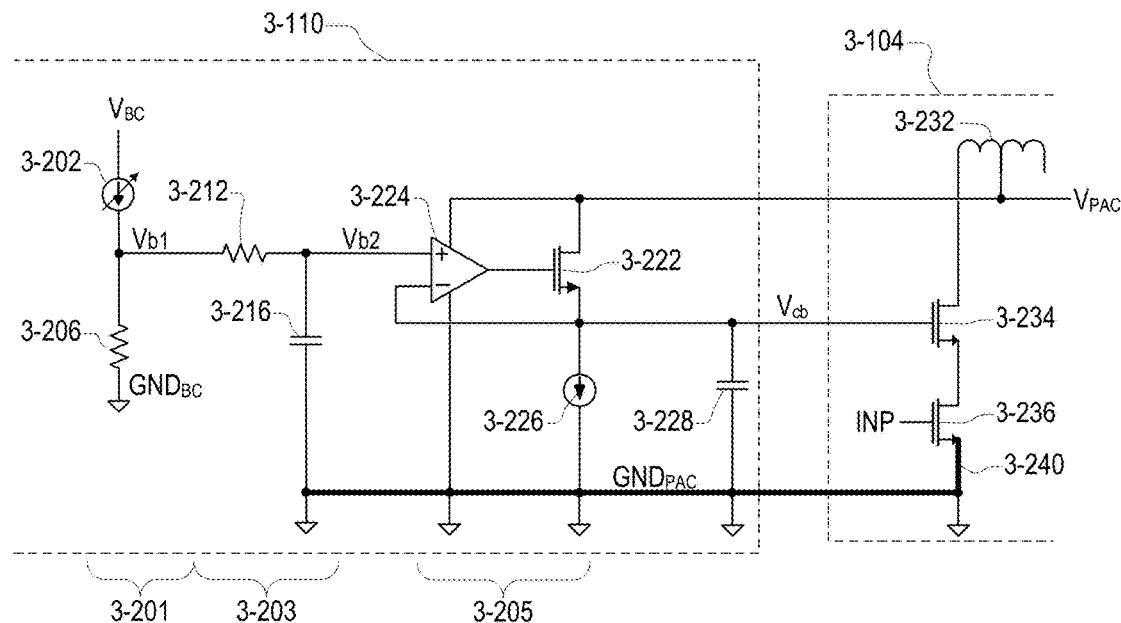
FIG. 3 is a diagram of a circuit according to another embodiment.

FIG. 3 is a diagram of a bias circuit 3-110 suitable for use in the bias circuit 1-110 of FIG. 1 according to another embodiment. Also shown is a subcircuit of a PA 3-104 suitable for use in the PA 1-104 of FIG. 1. The bias circuit 3-110 provides a cascode bias voltage Vcb to the PA 3-104.

The PA 3-104 includes a center-tapped coil 3-232, a cascode transistor 3-234, an input transistor 3-236, and a PA core ground circuit (or a reference ground circuit) 3-240. Because the PA 3-104 is substantially identical to the PA 2-104 of FIG. 2, described above, further description of the PA 3-104 is omitted in the interest of brevity.

The bias circuit 3-110 provides the cascode bias voltage Vcb to the PA 3-104. The bias circuit 3-110 includes a bias voltage generator (or a reference voltage circuit) 3-201, a filter circuit 3-203, a voltage follower circuit 3-205, and a bias capacitor 3-228.

The bias voltage generator 3-201 operates to provide a first bias voltage Vb1. The bias voltage generator 3-201 includes a programmable current source 3-202 and a first resistor 3-206.

The filter circuit 3-203 operates to combine the first bias voltage Vb1 with voltage fluctuations of the PA core ground $GND_{PAC}$ to produce a second bias voltage Vb2. The filter circuit 3-203 includes a second resistor 3-212 and a filter capacitor 3-216.

Because the bias voltage generator 3-201 and the filter circuit 3-203 are substantially identical, respectively, to the bias voltage generator 2-201 and the filter circuit 2-203 of FIG. 2, described above, further description of the bias voltage generator 3-201 and the filter circuit 3-203 is omitted in the interest of brevity.

The voltage follower circuit 3-205 operates to provide the cascode bias voltage Vcb according to the second bias voltage Vb2. The voltage follower circuit 3-205 is configured to provide the cascode bias voltage Vcb having a wide-band low output impedance and to isolate the bias voltage generator 3-201 and the filter circuit 3-203 from loads that receive the cascode bias voltage Vcb. The voltage follower circuit 3-205 includes an amplifier 3-224, a follower transistor 3-222, and a current source 3-226.

The core supply voltage $V_{PAC}$ is supplied to the amplifier 3-224 as a power supply voltage. A non-inverting input of the amplifier 3-224 is configured to receive the second bias voltage Vb2. An inverting input of the amplifier 3-224 receives the cascode bias voltage Vcb.

The amplifier 3-224 produces an output signal according to a difference between the non-inverting input and the inverting input of the amplifier 3-224. In an embodiment, the amplifier 3-224 includes a differential amplifier. In an embodiment, the amplifier 3-224 includes an operational amplifier (op-amp).

A gate of the follower transistor 3-222 is configured to receive the output signal of the amplifier 3-224. A drain of the follower transistor 3-222 is electrically connected to the PA core supply voltage $V_{PAC}$. A source of the follower transistor 3-222 is electrically connected to a first terminal of the current source 3-226. In an embodiment, the follower transistor 3-222 is an nMOSFET.

A second terminal of the current source 3-226 is electrically connected to the PA core ground $GND_{PAC}$ through the PA core ground circuit 3-240. The cascode bias voltage Vcb is provided at the first terminal of the current source 3-226.

The amplifier 3-224 and the follower transistor 3-222 are components of a feedback loop. The feedback loop operates to reduce or eliminate a voltage difference between the second bias voltage Vb2 and the cascode bias voltage Vcb.

A first terminal of the bias capacitor 3-228 is electrically connected to the first terminal of the current source 3-226. A second terminal of the bias capacitor 3-228 is electrically connected to the PA core ground $GND_{PAC}$ through the PA core ground circuit 3-240.

The bias capacitor 3-228 is configured to couple high-frequency signals present on the PA core ground $GND_{PAC}$ to the cascode bias voltage Vcb. In an embodiment, the high-frequency signals include frequencies of the baseband signal. The bias capacitor 3-228 operates to provide PA core ground $GND_{PAC}$ tracking to the cascode bias voltage Vcb.

Although the transistors of the embodiments shown in FIGS. 2 and 3 are nMOSFETs, embodiments are not limited thereto. A person of skill in the art in light of the teachings and disclosure herein would understand that other devices, such as p-channel MOSFETs (pMOSFETs), Junction FETs (JFETs), and Bipolar Junction Transistors (BJTs), may be used in place of one or more of the nMOSFETs shown in FIGS. 2 and 3 in other embodiments of the present disclosure.

Furthermore, a person of skill in the art in light of the teachings and disclosure herein would understand that gates of the nMOSFETs shown in FIGS. 2 and 3, as wells as gates of pMOSFETs and JFETs and bases of BJTs, correspond to control terminals, and that the sources and drains of the nMOSFETs shown in FIGS. 2 and 3, as wells as sources and drains of pMOSFETs and JFETs and collectors and emitters of BJTs, correspond to conduction terminals.

Figure 4:
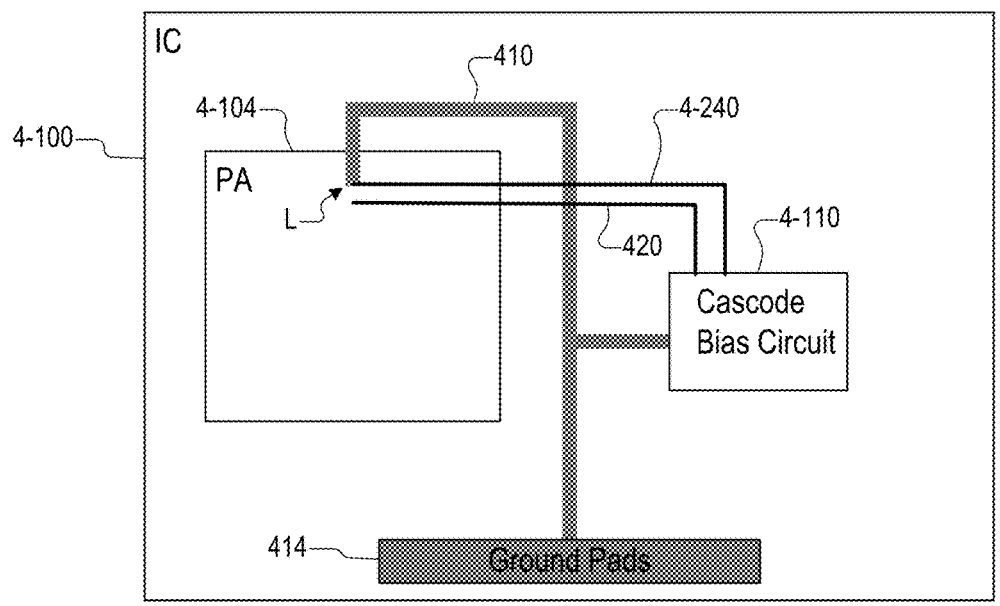
FIG. 4 illustrates a layout of an integrated circuit according to an embodiment.

FIG. 4 illustrates a physical layout of an integrated circuit 4-100 according to an embodiment. The integrated circuit includes a Power Amplifier (PA) 4-104 and a bias circuit 4-110. The bias circuit 4-110 provides a cascode bias voltage to one or more cascode transistors within the PA 4-104 using a cascode bias voltage conductor 420.

The integrated circuit 4-100 further includes a power ground network 410 and a PA core ground circuit 4-240. The power ground network 410 comprises one or more conductive elements that provide power ground to the PA 4-104 and the bias circuit 4-110, providing a return path through which return currents flow to ground pads 414. The conductive elements may include one or more conductive traces on any of one or more metal layers of the integrated circuit and one or more conductive vias between two conductive traces located on different metal layers of the integrated circuit.

The PA core ground circuit 4-240 is connected to the power ground network 410 at a location L near an input circuit of the PA 4-104. The PA core ground circuit 4-240 is also connected to components within the bias circuit 4-110.

In an embodiment, the PA core ground circuit 4-240 is only connected to components of the bias circuit 4-110 that do not respectively generate significant return currents to the ground pads 414, that is, the PA core ground circuit 4-240 is only connected to components of the bias circuit 4-110 that do not draw significant current from the power supply voltage. In an embodiment, the PA core ground circuit 4-240 is connected only to components within the bias circuit 4-110 and to the power ground network 410 at one or more locations near the cascode transistors of the PA 4-104 that receive the cascode bias voltage.

Using the PA core ground circuit 4-240 to provide a ground reference to the bias circuit 4-110 results in a voltage of the ground reference being substantially identical to a voltage of the power ground network 410 at the location L.

In the embodiment shown in FIG. 4, the PA core ground circuit 4-240 is laid out on a path close to and substantially similar to the path of the cascode bias voltage conductor 420. In another embodiment, the PA core ground circuit 4-240 is laid out on a substantially straight path directly from the bias circuit 4-110 to the location L.

FIG. 5 illustrates a process 500 of biasing, using a bias circuit, a biased transistor.

At S502, a reference ground is provided, using a core ground circuit (or a reference ground circuit), to selected components of the bias circuit. In an embodiment, components of the bias circuit that produce substantial return currents to a power ground network are excluded from the selected components. In an embodiment, the selected components are selected from one or more components that do not generate return currents in a power ground network. In an embodiment, the core ground circuit is connected to the power ground network only at one or more locations near the biased transistor. In an embodiment, components directly connected to the core ground circuit include only one or more of the biased transistor, components near the biased transistor, and components of the bias circuit.

Conductive elements of the core ground circuit are electrically isolated from the power ground network. Using the core ground circuit to provide the ground reference to the bias circuit produces a ground reference that has a voltage substantially identical to the voltage of the power ground network at the location near the biased transistor.

At S504, a first voltage is generated by a reference voltage circuit (or a bias voltage generator) of the bias circuit. In an embodiment, the first voltage is produced using a current source. In an embodiment, the current source is a programmable current source.

At S506, a second voltage is generated according to the first voltage using a filter circuit of the bias circuit. The filter circuit has one or more components connected to the core ground circuit.

In an embodiment, a corner frequency of the filter circuit is selected to be lower than substantially all of the frequencies that make up a baseband signal, e.g. lower than 99% of all frequencies that make up a baseband signal. In an implementation, the corner frequency of the filter circuit 2-203 is selected to be lower than 99.5% of the frequencies that make up the baseband signal. In another implementation, the corner frequency of the filter circuit 2-203 is selected to be lower than 99.8% of the frequencies that make up the baseband signal. In an embodiment, the corner frequency is less than 100 KHz.

In an embodiment, the filter circuit is a resistor-capacitor filter circuit. In an embodiment, the filter circuit acts as a high-pass filter configured to generate the second voltage by combining the first voltage with signals on the core ground circuit having frequencies above the corner frequency.

At S508, a bias voltage is generated according to the second voltage using a voltage follower circuit. In an embodiment, the voltage follower circuit includes a transistor electrically connected to a current source.

In an embodiment, the voltage follower circuit includes a feedback loop configured to generate a bias voltage substantially identical to the second voltage. The feedback loop may include an amplifier, such as a differential amplifier or an operational amplifier (opamp).

At S512, a ground tracking signal is combined with the bias voltage so that the bias voltage tracks the ground reference. The ground tracking signal may include high frequency signals of the ground reference. In an embodiment, the high frequency signals are associated with frequencies of a baseband signal.

In an embodiment, the ground tracking signal is provided using a capacitor. The capacitor may be electrically connected between the bias voltage and the reference ground.

At S516, the bias voltage is provided to the biased transistor. In an embodiment, the biased transistor is a transistor configured to operate as a cascode transistor.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A circuit comprising:
a reference voltage circuit;
a filter circuit configured to receive an output of the reference voltage circuit; and
a voltage follower configured to receive an output of the filter circuit and generate a bias voltage,
wherein the filter circuit is configured to combine signals on a reference ground with the output of the reference voltage circuit,
wherein the filter circuit includes a resistor and a capacitor, the resistor being coupled between the reference voltage circuit and the capacitor, and
wherein the circuit is configured to provide the bias voltage to a biased cascode transistor included in a cascode stage.

2. The circuit of claim 1, wherein the voltage follower circuit includes:
a transistor; and
a current source coupled to a conduction terminal of the transistor,
wherein a control terminal of the transistor is configured to receive the output of the filter circuit.

3. The circuit of claim 1, wherein the voltage follower circuit includes a feedback loop circuit including an amplifier.

4. The circuit of claim 1, wherein a power supply voltage supplied to the biased cascade transistor is supplied to the voltage follower circuit.

5. The circuit of claim 1, wherein the signals have respective frequencies higher than a corner frequency of the filter circuit.

6. The circuit of claim 5, wherein the corner frequency is lower than frequencies making up a substantial majority of a baseband signal.

7. The circuit of claim 1, wherein the circuit is provided in an integrated circuit.

8. A circuit comprising:
a reference voltage circuit;
a filter circuit configured to receive an output of the reference voltage circuit;
a voltage follower configured to receive an output of the filter circuit and generate a bias voltage;
a biased transistor; and
a reference ground circuit,
wherein the filter circuit is configured to combine signals on a reference ground with the output of the reference voltage circuit,
wherein the filter circuit includes a resistor-capacitor filter,
wherein the circuit is configured to provide the bias voltage to the biased transistor, and
wherein the reference ground circuit is coupled between the biased transistor and one or more components of the circuit.

9. The circuit of claim 8, further comprising:
a capacitor configured to electrically couple the bias voltage to the reference ground circuit.

10. The circuit of claim 8, wherein the reference ground circuit is directly connected to a power ground network at a location near the biased transistor.

11. A method of providing a bias voltage, comprising:
generating a reference voltage using a reference voltage circuit;
filtering the reference voltage to generate a second voltage using a filter circuit; and
generating the bias voltage according to the second voltage using a voltage follower circuit,
wherein filtering the reference voltage includes combining a fluctuation of a reference ground with the reference voltage,
wherein the voltage follower circuit includes an amplifier configured in a feedback loop, and
wherein the filter circuit includes a resistor and a capacitor, the resistor being coupled between the reference voltage circuit and the capacitor.

12. The method of claim 11, further comprising providing the bias voltage to a transistor, wherein the transistor is configured to operate as a cascode transistor.

13. The method of claim 12, further including providing a core power supply voltage to the transistor and the voltage follower circuit.

14. The method of claim 11, wherein the reference voltage circuit is directly connected to a bias circuit ground, the filter circuit is connected to the reference ground, and the voltage follower circuit is connected to the reference ground.

15. The method of claim 14, wherein the fluctuation has a frequency greater than a corner frequency of the filter circuit.

16. The method of claim 15, wherein the corner frequency of the filter circuit is lower than substantially all of the frequencies that make up a baseband signal.

17. The method of claim 14, further comprising coupling, using a capacitor, the fluctuation of the reference ground to the bias voltage.

* * * * *